(12) United States Patent
Lee

(10) Patent No.: US 11,049,545 B2
(45) Date of Patent: Jun. 29, 2021

(54) METHODS FOR ADJUSTING ROW HAMMER REFRESH RATES AND RELATED MEMORY DEVICES AND SYSTEMS

(71) Applicant: Micron Technology, Inc., Boise, ID (US)

(72) Inventor: Joo-Sang Lee, Frisco, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/391,560

(22) Filed: Apr. 23, 2019

(65) Prior Publication Data

US 2020/0342934 A1    Oct. 29, 2020

(51) Int. Cl.
| G11C 8/12 | (2006.01) |
| G11C 11/406 | (2006.01) |
| G11C 11/408 | (2006.01) |
| G11C 11/4076 | (2006.01) |

(52) U.S. Cl.
CPC .... *G11C 11/40618* (2013.01); *G11C 11/4076* (2013.01); *G11C 11/4087* (2013.01); *G11C 11/40615* (2013.01)

(58) Field of Classification Search
CPC ............. G11C 11/40611; G11C 11/406; G11C 11/40615; G11C 11/4087; G11C 11/40618; G11C 11/408; G11C 11/4076
See application file for complete search history.

(56) References Cited

U.S. PATENT DOCUMENTS

| 7,233,538 | B1 | 6/2007 | Wu et al. |
| 9,032,141 | B2 | 5/2015 | Bains et al. |
| 9,183,917 | B1 | 11/2015 | Cho |
| 9,640,242 | B1 | 5/2017 | Lo et al. |
| 9,653,142 | B1 | 5/2017 | Kihara |
| 9,741,421 | B1 | 8/2017 | Hedden |
| 9,747,971 | B2 | 8/2017 | Bains et al. |
| 9,805,783 | B2 | 10/2017 | Ito et al. |
| 10,067,672 | B2 | 9/2018 | Chinnakkonda Vidyapoornachary et al. |
| 10,170,174 | B1 | 1/2019 | Ito et al. |
| 10,410,730 | B1 | 9/2019 | Boenapalli et al. |
| 10,599,504 | B1* | 3/2020 | BeSerra ............. G06F 11/0793 |
| 2005/0152199 | A1 | 7/2005 | Park et al. |
| 2006/0195289 | A1 | 8/2006 | Choi et al. |

(Continued)

FOREIGN PATENT DOCUMENTS

WO    2018/217582 A3    11/2018

OTHER PUBLICATIONS

International Search Report for Application No. PCT/US2020/018750, dated Jun. 16, 2020, 3 pages.

(Continued)

*Primary Examiner* — Hien N Nguyen

(74) *Attorney, Agent, or Firm* — TraskBritt

(57) ABSTRACT

Methods of operating a memory device are disclosed. A method may include determining a number of active commands associated with at least one memory bank of a memory device during a first time interval. The method may further include adjusting a row hammer refresh rate for the at least one memory bank for a second time interval based on the number of active commands associated with the at least one memory bank during the first time interval. A memory device and an electronic system are also described.

20 Claims, 15 Drawing Sheets

(56) References Cited

U.S. PATENT DOCUMENTS

| | | |
|---|---|---|
| 2007/0030019 A1 | 2/2007 | Kinsley |
| 2007/0106838 A1 | 5/2007 | Choi |
| 2007/0121408 A1 | 5/2007 | Yang et al. |
| 2007/0140315 A1 | 6/2007 | Janzen et al. |
| 2009/0058539 A1 | 3/2009 | Hong |
| 2009/0147607 A1 | 6/2009 | Nin |
| 2009/0238020 A1 | 9/2009 | Mayer et al. |
| 2009/0316501 A1 | 12/2009 | Bunker et al. |
| 2010/0142291 A1 | 6/2010 | Joo et al. |
| 2010/0182851 A1 | 7/2010 | Lee et al. |
| 2010/0182862 A1 | 7/2010 | Teramoto |
| 2011/0055671 A1 | 3/2011 | Kim et al. |
| 2011/0299352 A1* | 12/2011 | Fujishiro ............... G11C 11/406 365/222 |
| 2012/0099389 A1 | 4/2012 | Park et al. |
| 2012/0170396 A1 | 7/2012 | Kim |
| 2012/0249219 A1 | 10/2012 | Shoemaker |
| 2012/0250680 A1 | 10/2012 | Tsuchiya et al. |
| 2012/0327734 A1* | 12/2012 | Sato ................. G11C 11/40615 365/226 |
| 2013/0279284 A1 | 10/2013 | Jeong |
| 2015/0003164 A1 | 1/2015 | Roohparvar |
| 2015/0036445 A1 | 2/2015 | Yoshida et al. |
| 2015/0058549 A1 | 2/2015 | Jeffrey et al. |
| 2015/0235694 A1 | 8/2015 | Kim et al. |
| 2015/0301932 A1 | 10/2015 | Oh et al. |
| 2015/0373876 A1 | 12/2015 | Berke |
| 2015/0380073 A1* | 12/2015 | Joo ....................... G11C 11/406 365/189.05 |
| 2016/0125921 A1 | 5/2016 | Kambegawa |
| 2016/0125931 A1 | 5/2016 | Doo et al. |
| 2016/0155490 A1 | 6/2016 | Shin et al. |
| 2016/0203854 A1 | 7/2016 | Kim |
| 2016/0300816 A1 | 10/2016 | Park |
| 2016/0307620 A1 | 10/2016 | Chun et al. |
| 2017/0047110 A1 | 2/2017 | Kang et al. |
| 2017/0068466 A1 | 3/2017 | Kiyooka |
| 2017/0083259 A1 | 3/2017 | Lee et al. |
| 2017/0117033 A1 | 4/2017 | Doo et al. |
| 2017/0148504 A1 | 5/2017 | Saifuddin et al. |
| 2017/0186481 A1 | 6/2017 | Oh et al. |
| 2017/0345483 A1 | 11/2017 | Wang |
| 2018/0005690 A1 | 1/2018 | Morgan et al. |
| 2018/0114737 A1 | 4/2018 | Choi |
| 2018/0166124 A1 | 6/2018 | Suwada |
| 2018/0197599 A1 | 7/2018 | Choi et al. |
| 2018/0218767 A1* | 8/2018 | Wolff ................. G11C 11/4096 |
| 2019/0122723 A1* | 4/2019 | Ito ......................... G11C 11/403 |
| 2019/0196740 A1 | 6/2019 | Notani et al. |
| 2020/0098421 A1 | 3/2020 | Alsasua et al. |
| 2020/0402569 A1 | 12/2020 | He et al. |
| 2021/0020231 A1 | 1/2021 | Deng et al. |
| 2021/0020232 A1 | 1/2021 | Bayat et al. |

OTHER PUBLICATIONS

Written Opinion of the International Searching Authority for Application No. PCT/US2020/018750, dated Jun. 16, 2020, 5 pages.

Ito et al., Apparatus and Methods for Refreshing Memory, U.S. Appl. No. 15/789,897, filed Oct. 27, 2017.

Meier et al., U.S. Appl. No. 16/396,363 titled Methods for Controlling Row Hammer Refresh Operations of a Memory Device, and Related Memory Devices and Systems, filed Apr. 26, 2019.

Zhang et al., U.S. Appl. No. 16/135,877, titled Row Hammer Refresh for Memory Devices, filed Sep. 19, 2018.

* cited by examiner

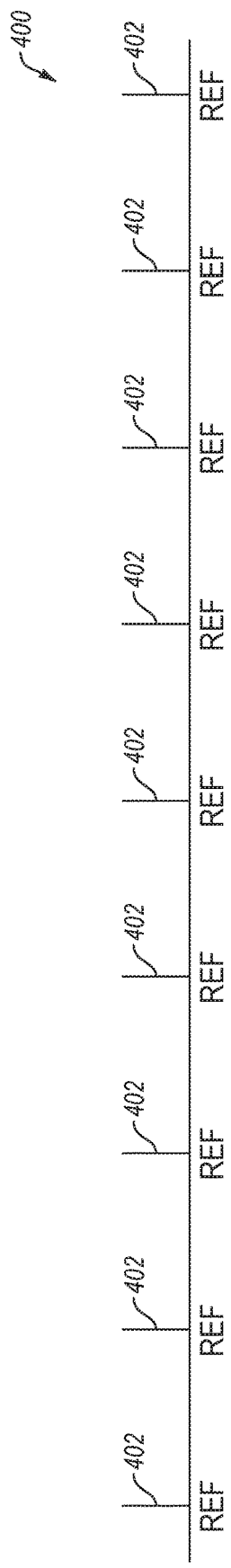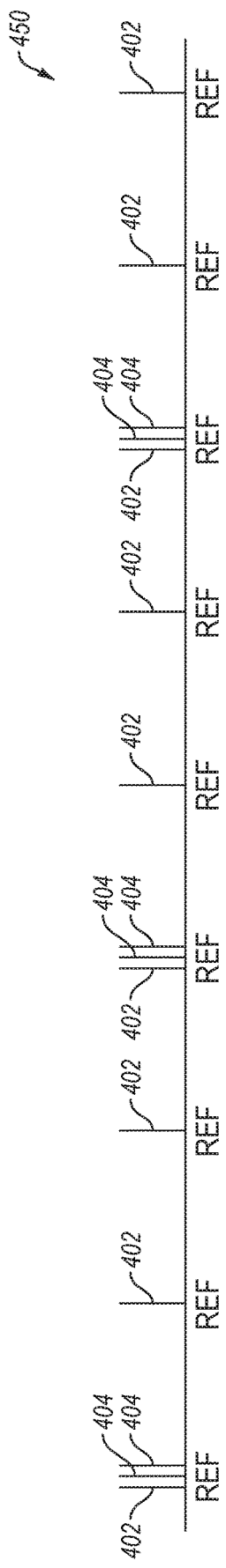

| Multi-Bit Word | RHR Rate | 8 REF |
|---|---|---|
| 000 | Every REF cmd | 11-11-11-11-11-11-11-11- |
| 001 | 1 of 2 | 11-xx-11-xx-11-xx-11-xx- |
| 010 | 1 of 3 | 11-xx-xx-11-xx-xx-11-xx- |
| 011 | 1 of 4 | 11-xx-xx-xx-11-xx-xx-xx- |
| 100 | 1 of 5 | 11-xx-xx-xx-xx-11-xx-xx- |
| 101 | 1 of 6 | 11-xx-xx-xx-xx-xx-11-xx- |
| 110 | 1 of 7 | 11-xx-xx-xx-xx-xx-xx-11- |
| 111 | 1 of 8 | 11-xx-xx-xx-xx-xx-xx-xx- |

*FIG. 10B*

METHODS FOR ADJUSTING ROW HAMMER REFRESH RATES AND RELATED MEMORY DEVICES AND SYSTEMS

TECHNICAL FIELD

Embodiments of the disclosure relate to adjusting row hammer refresh rates of a memory device and, more specifically, to independently adjusting a row hammer refresh rate of one or more memory banks of a memory device based on memory bank activity. Yet more specifically, some embodiments relate to methods for such adjusting, and related memory devices and systems.

BACKGROUND

Memory devices are typically provided as internal, semiconductor, integrated circuits in computers or other electronic systems. There are many different types of memory including volatile and non-volatile memory. Volatile memory may require power to maintain its data (e.g., host data, error data, etc.) and includes random access memory (RAM), dynamic random access memory (DRAM), synchronous dynamic random access memory (SDRAM), content addressable memory (CAM), thyristor random access memory (TRAM), low-power double date rate synchronous dynamic random access memory (LPDDR SDRAM), and graphics DDR SDRAM, among others.

As memory density has increased, intermittent failure has appeared in some memory devices, which may experience failures due to repeated access to a particular row of memory cells (e.g., cells coupled to an access line). For example, rows physically adjacent a row being frequently accessed have an increased probability of experiencing data corruption. The repeated access of a particular row can be referred to as a "hammering" event, and the hammering of a row may cause issues such as migration across a pass gate, for example. Leakage and parasitic currents caused by the hammering of a row may cause data corruption in a non-accessed physically adjacent row, which may be referred to as a neighbor row or victim row. The resulting corruption issue may be referred to as hammer disturb and/or row hammer disturb, for instance.

The row hammer effect is due to the nature of a memory cell, which may include one transistor and one capacitor. The charge state of a capacitor may determine whether a memory cell stores a "1" or "0" as a binary value. In addition, a large number of memory cells are packed tightly together. The closely packed cells may cause an activated capacitor to have an effect on a charge of an adjacent capacitor, especially when one of the cells is rapidly activated (e.g., a row hammer effect). In addition, the capacitors may have a natural discharge rate and may be rewritten in order to compensate for this discharge, referred to as "refreshing."

Some approaches to reducing the adverse effects of row hammering on adjacent rows include refreshing adjacent rows responsive to a determination that a hammering event has occurred. For example, responsive to determining that a particular row has been the target of repeated accesses (e.g., the row has undergone more than a threshold number of accesses within a refresh period), its physically adjacent neighbor rows may be selected for a targeted refresh operation, which may be referred to as a row hammer refresh operation.

BRIEF DESCRIPTION OF THE SEVERAL VIEWS OF THE DRAWINGS

FIGS. 4A and 4B depict other example timing diagrams including a number of refresh commands associated with independent auto refresh and row hammer refresh pumps of a memory device.

FIG. 10B is a table illustrating various row hammer refresh rates and associated multi-bit words for programming the row hammer refresh rates.

DETAILED DESCRIPTION

Generally, a "row hammer event" occurs when a refresh command is executed to refresh word lines that are adjacent to a hammered word line. A particular word line is "hammered" when it is accessed via memory access operations, such as an active command, in a manner that could potentially lead to data errors in adjacent word lines. Typically, a word line is hammered when it accessed more than a predetermined number of times.

A row hammer refresh operation may be generally executed via a refresh steal operation where a refresh operation (or a portion of a refresh operation) sent from a memory device controller and received at a memory device is "stolen" and a row hammer refresh is executed in place of an auto refresh.

Various embodiments of the disclosure relate to adjusting row hammer refresh rates for memory devices. More specifically, in some embodiments, row hammer refresh rates for one or more memory banks of a memory device may be independently adjusted based on an amount of activity (e.g., a number of row accesses) associated with the one or more memory banks. Yet more specifically, according to some embodiments, a number of active signals associated with a memory bank (e.g., a number of active signals received at the memory bank) may be counted (e.g., during a time interval), and a row hammer refresh rate of the memory bank (e.g., for a subsequent time interval) may be adjusted based on the number of active signals.

Various embodiments, as disclosed more fully herein, may decrease power consumption and processing overhead of a memory device without substantially decreasing performance and/or reliability of the memory device. More specifically, at least some embodiments may eliminate unnecessary row hammer refresh operations, thus reducing power consumption while still mitigating undesirable row hammer effects.

Figure 1:
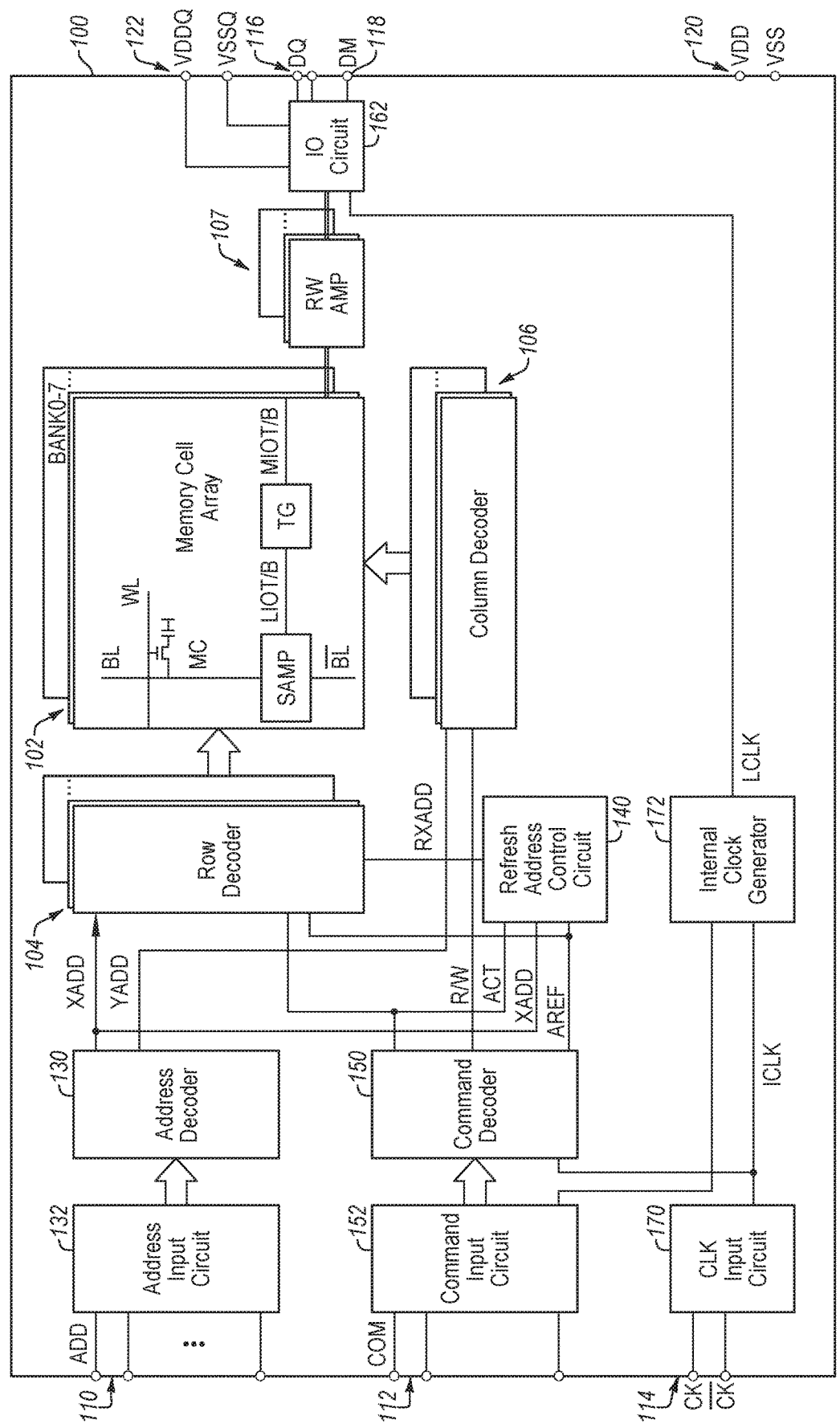
FIG. 1 is a block diagram of a memory device, in accordance with at least one embodiment of the present disclosure.

FIG. 1 is a block diagram of a memory device 100, in accordance with one or more embodiments of the present disclosure. Memory device 100 may include, for example, a DRAM (dynamic random access memory), a SDRAM (synchronous dynamic random access memory), a DDR SDRAM (double data rate DRAM), a SGRAM (synchronous graphics random access memory), LPDDR SDRAM, a graphics DDR SDRAM, content addressable memory (CAM), or any combination thereof. Memory device 100, which may be integrated on a semiconductor chip, may include a memory cell array 102.

In the embodiment of FIG. 1, memory cell array 102 is shown as including eight memory banks BANK0-7. More or fewer banks may be included in memory cell array 102 of other embodiments. Each memory bank includes a number of word lines WL, a number of bit lines BL and $\overline{BL}$, and a number of memory cells MC arranged at intersections of the number of word lines WL and the number of bit lines BL and $\overline{BL}$. The selection of a word line WL may be performed by a row decoder 104 and the selection of the bit lines BL and $\overline{BL}$ may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and $\overline{BL}$ are coupled to a respective sense amplifier SAMP. Read data from bit line BL or $\overline{BL}$ may be amplified by sense amplifier SAMP, and transferred to read/write amplifiers 107 over complementary local data lines (LIOT/B), transfer gate (TG), and complementary main data lines (MIOT/B). Conversely, write data outputted from read/write amplifiers 107 may be transferred to sense amplifier SAMP over complementary main data lines MIOT/B, transfer gate TG, and complementary local data lines LIOT/B, and written in memory cell MC coupled to bit line BL or $\overline{BL}$.

Memory device 100 may be generally configured to be receive various inputs (e.g., from an external controller) via various terminals, such as address terminals 110, command terminals 112, clock terminals 114, data terminals 116, and data mask terminals 118. Memory device 100 may include additional terminals such as power supply terminals 120 and 122.

During a contemplated operation, one or more command signals COM, received via command terminals 112, may be conveyed to a command decoder 150 via a command input circuit 152. Command decoder 150 may include a circuit configured to generate various internal commands via decoding one or more command signals COM. Examples of the internal commands include an active signal ACT, a read/write signal R/W, and a refresh signal AREF.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Row address XADD, which may be supplied to a refresh address control circuit 140, may be a signal including multiple bits (which may be transmitted in series or in parallel) and may correspond to a specific row of a memory bank (e.g., the memory bank activated by, for example, active signal ACT).

Active signal ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and the bit line BL/$\overline{BL}$ specified by column address YADD may be selected.

In response to active signal ACT, a read signal, a row address XADD, and a column address YADD, data may be read from memory cell MC specified by row address XADD and column address YADD. The read data may be output via a sense amplifier SAMP, a transfer gate TG, read/write amplifier 107, an input/output circuit 162, and data terminal 116. Further, in response to active signal ACT, a write signal, a row address XADD, and a column address YADD, write data may be supplied to memory cell array 102 via data terminal 116, input/output circuit 162, read/write amplifier 107, transfer gate TG, and sense amplifier SAMP. The write data may be written to memory cell MC specified by row address XADD and column address YADD.

Refresh signal AREF may include a pulse signal that is activated when a command signal COM includes an auto-refresh command. Refresh signal AREF may be supplied to refresh address control circuit 140, which is also configured to receive active signal ACT and row address XADD. Refresh address control circuit 140 is configured to provide a row address RXADD that specifies a particular word line to be refreshed. In some examples, refresh address control circuit 140 may provide row address RXADD responsive to sequential refresh commands received from an external controller (not shown in FIG. 1). Further, refresh address control circuit 140 may be configured to "steal" or otherwise preempt a refresh operation received from the external controller and replace that refresh operation with a row hammer refresh operation. In this example, refresh address control circuit 140 may provide row address RXADD responsive to a row hammer refresh event.

Clock signals CK and $\overline{CK}$ may be received via clock terminals 114. A clock input circuit 170 may generate internal clock signals ICLK based on clock signals CK and $\overline{CK}$. Internal clock signals ICLK may be conveyed to various components of memory device 100, such as command decoder 150 and an internal clock generator 172.

Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When data mask signal DM is activated, overwrite of corresponding data may be prohibited.

Figure 2:
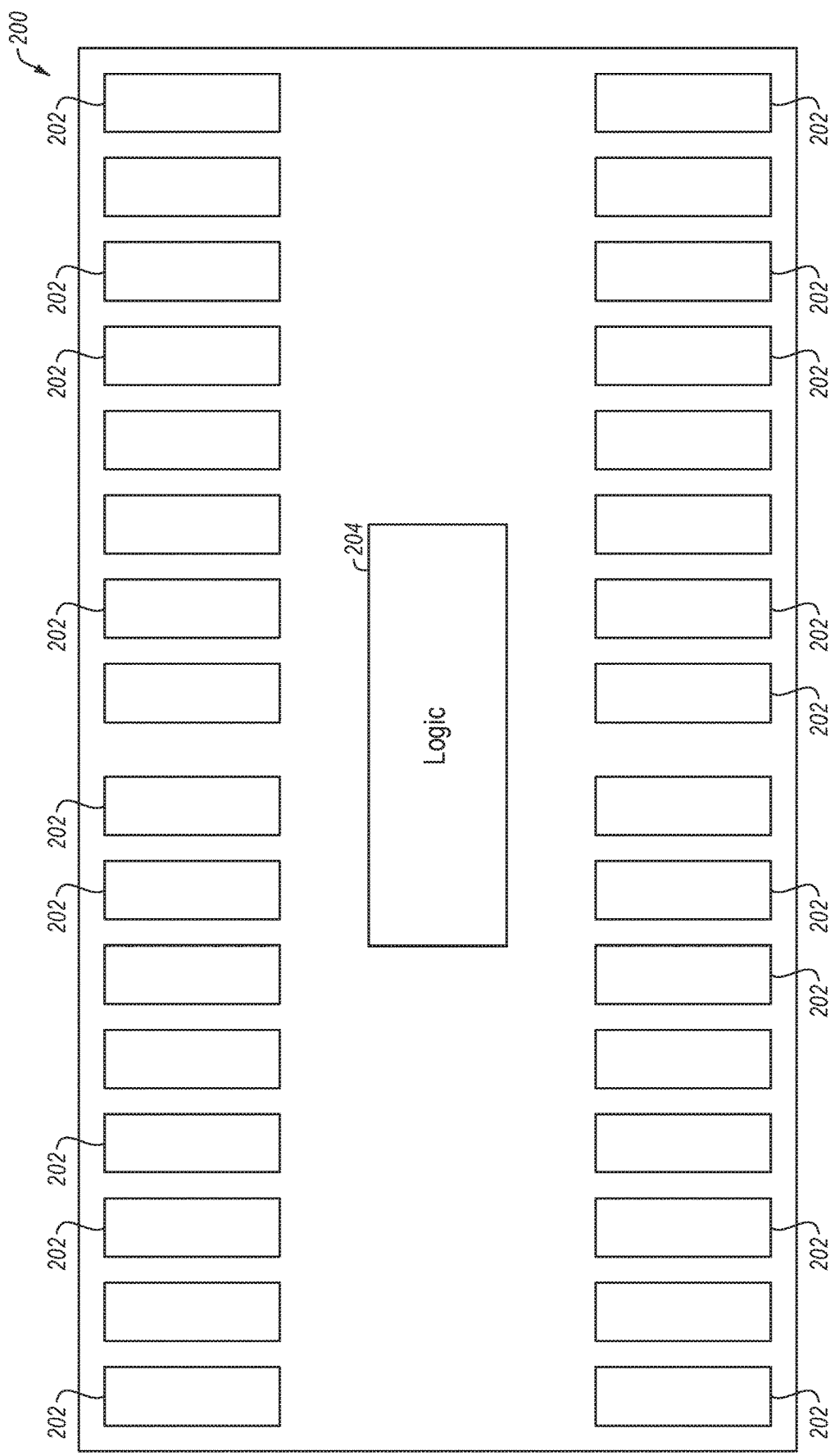
FIG. 2 illustrates an example integrated circuit including a number of memory banks, according to at least one embodiment of the present disclosure.

FIG. 2 illustrates an example integrated circuit (IC) (also referred to herein as a "die") 200 including a number of memory banks 202. IC 200 also includes logic 204 for performing one or more refresh operations, including row hammer refresh (RHR) operations. Further, in at least some embodiments, each memory bank 202 may include dedicated logic (e.g., one or more address registers (e.g., flip-flops or latches); not shown in FIG. 2) for storing one or more row hammer addresses (RHAs) for the associated memory bank. As will be appreciated by a person having ordinary skill in the art, for memory systems (e.g., including single or multi-die packages), it may be desirable to mitigate row hammer effects while also minimizing power consumption.

Figure 3A:
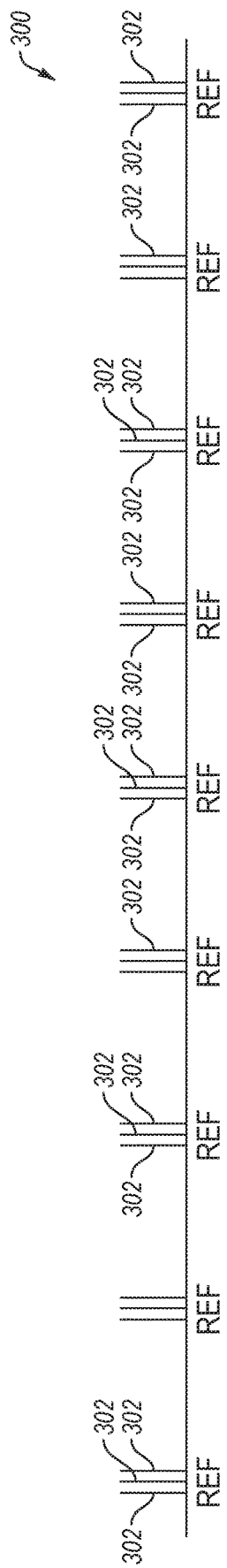
FIGS. 3A and 3B depict example timing diagrams including a number of refresh commands associated with a memory device.
Figure 3B:
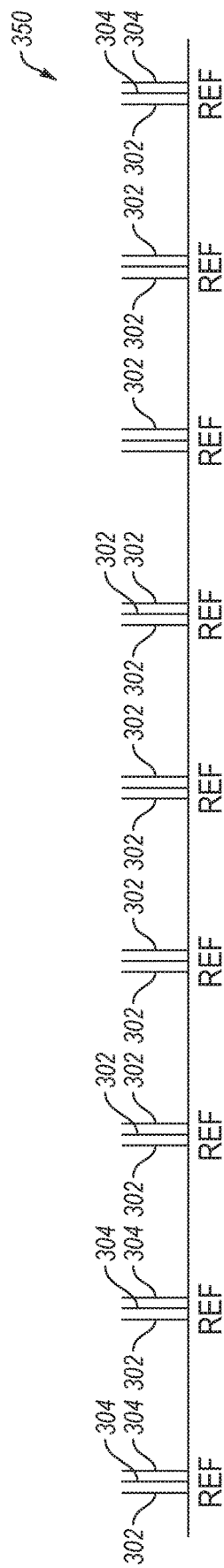

FIG. 3A depicts a timing diagram 300 including a number of refresh commands REFs for a refresh sequence of a memory device, wherein each refresh command REF includes a number of refreshes (also referred to herein as "pumps") 302. In timing diagram 300, each refresh 302 of each refresh command REF is used for an auto refresh. In other words, in this example, none of the refreshes shown in FIG. 3A are stolen for a RHR operation. FIG. 3B depicts a timing diagram 350 including a number of refresh commands REFs. In timing diagram 350, for every eight refresh commands REFs, four refreshes (depicted as refreshes 304) are stolen for RHRs. For example, for each of the two initial refresh commands REF of the refresh sequence shown in FIG. 3B, two refreshes may be stolen for refreshing neighboring word lines. In other words, for every eight refresh commands REFs, two refreshes (depicted by reference numeral 304) may be stolen for refreshing the two word lines adjacent (+1/−1) a hammered row.

FIG. 4A depicts a timing diagram 400 including a number of refresh commands REFs, wherein each refresh command REF includes one refresh (e.g., one pump). In timing diagram 400, all refreshes are auto refreshes 402. In other words, none of the refreshes shown in FIG. 4A are stolen for a RHR operation. FIG. 4B depicts a timing diagram 450 including a number of refresh commands REFs. In timing diagram 450, for every three refresh commands REFs, two refreshes (depicted by reference numeral 404) are used refreshing the two word lines adjacent (+1/−1) a hammered row.

In contrast to the operations illustrated in FIG. 3B, the RHR operations illustrated in FIG. 4B may not use auto refresh pumps. Rather, according to some embodiments, dedicated RHR pumps may be used for RHR operations. Stated another way, auto refresh pumps and RHR pumps may be independent, and therefore it may not be necessary to steal an auto refresh pump for a RHR operation.

In some systems, if, during a time interval (e.g., a "steal phase" or "steal series"), at least one row access does not occur at a memory device (i.e., no memory banks of a memory device receive an active command), row hammered operations may be skipped for a subsequent time interval (e.g., the subsequent steal phase or steal series). However, in these systems, if, during a time interval, a row access occurs at only one memory bank, or a just a few memory banks, of a memory device, a RHR operation may still occur at each memory bank of the memory device during a subsequent time interval (e.g., regardless of whether or not a row access occurred at each memory bank). Therefore, power is unnecessarily used to perform RHR operations on memory banks that did not receive at least one row access. Stated another way, regardless of whether or not a row access was associated with a memory bank during a time interval, a RHR operation is still performed on the memory bank during a subsequent time interval.

In accordance with various embodiments of the present disclosure, a row hammer refresh rate of each memory bank of a memory device may be adjustable. More specifically, in some embodiments, based on activity (or lack thereof) associated with a memory bank, a row hammer refresh operation of the memory bank may be activated or deactivated, or in some cases unmodified. Further, in some embodiments, based on activity (or lack thereof) associated with a memory bank, a row hammer refresh rate of the memory bank may be increased or decreased, or in some cases, unmodified.

More specifically, according to some embodiments, a row hammer refresh of a memory bank may be activated or deactivated based on whether or not activity occurred at the memory bank. For example, if a memory bank did not receive at least one active signal (e.g., during a time interval), a row hammer refresh may not be performed on the memory bank (e.g., the row hammer refresh rate is zero) (e.g., during a subsequent time interval). Further, if the memory bank did receive at least one active signal (e.g., during a time interval), a row hammer refresh may be performed on the memory bank (e.g., during a subsequent time interval).

Alternatively or additionally, a row hammer refresh rate of a memory bank may be independently adjusted (e.g., via one or more bits) based on an amount of activity of the memory bank. In a more specific example, based on a relatively high amount of activity associated with a memory bank (e.g., 25, 50, or 100 active commands, or more), a row hammer refresh rate for the memory bank may be set (e.g., via one or more bits) to a relatively high rate (e.g., such that two refreshes are stolen for every refresh command). As another example, based on an average amount of activity associated with the memory bank, the row hammer refresh rate for the memory bank may be set (e.g., via one or more bits) to an average rate (e.g., such that two refreshes are stolen for every three refresh commands). In yet another example, based on a relatively low amount of activity associated with a memory bank (e.g., 15, 10, or 5 active commands, or less), the row hammer refresh rate for the memory bank may be set (e.g., via one or more bits) to a relatively low rate (e.g., such that two refreshes are stolen for every six refresh commands). According to some embodiments, an amount of activity of a memory bank during a first time interval may be detected, and a row hammer refresh rate for the memory bank for a second, subsequent time interval may be set based on the detected amount of activity during the first time interval.

Figure 5:
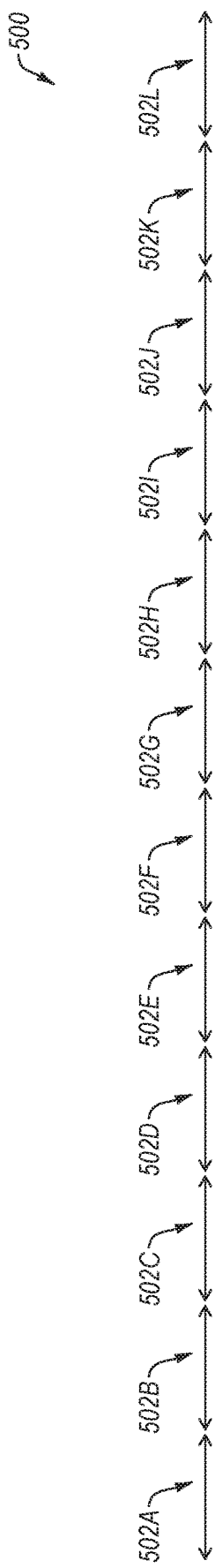
FIG. 5 illustrates a timing diagram including a number of example time intervals associated with a number of memory banks of a memory device, in accordance with various embodiments of the present disclosure.

FIG. 5 is a timing diagram 500 depicting a number of time intervals (e.g., steal series) 502A-502L for a number of memory banks (e.g., all memory banks) of a memory device. According to various embodiments of the present disclosure, for each time interval for the number of memory banks that does not include at least one row access (e.g., does not include an active signal), a subsequent time interval for the number of memory banks may not include a RHR operation (e.g., the row hammer refresh rate is zero). In some embodiments, for example, activity (e.g., one or more active signals) associated with a memory bank of a memory device may be monitored during a sample period (e.g., during a time interval 502). Further, based on the activity (or lack thereof), a scheduled RHR operation may or may not be performed (e.g., upon completion of the sample period). More specifically, for example, if time interval 502D does not include an active signal, a row hammer refresh rate for the number of memory banks may be set such that a RHR operation may not occur at the number of memory banks during a subsequent time interval 502E.

Figure 6:
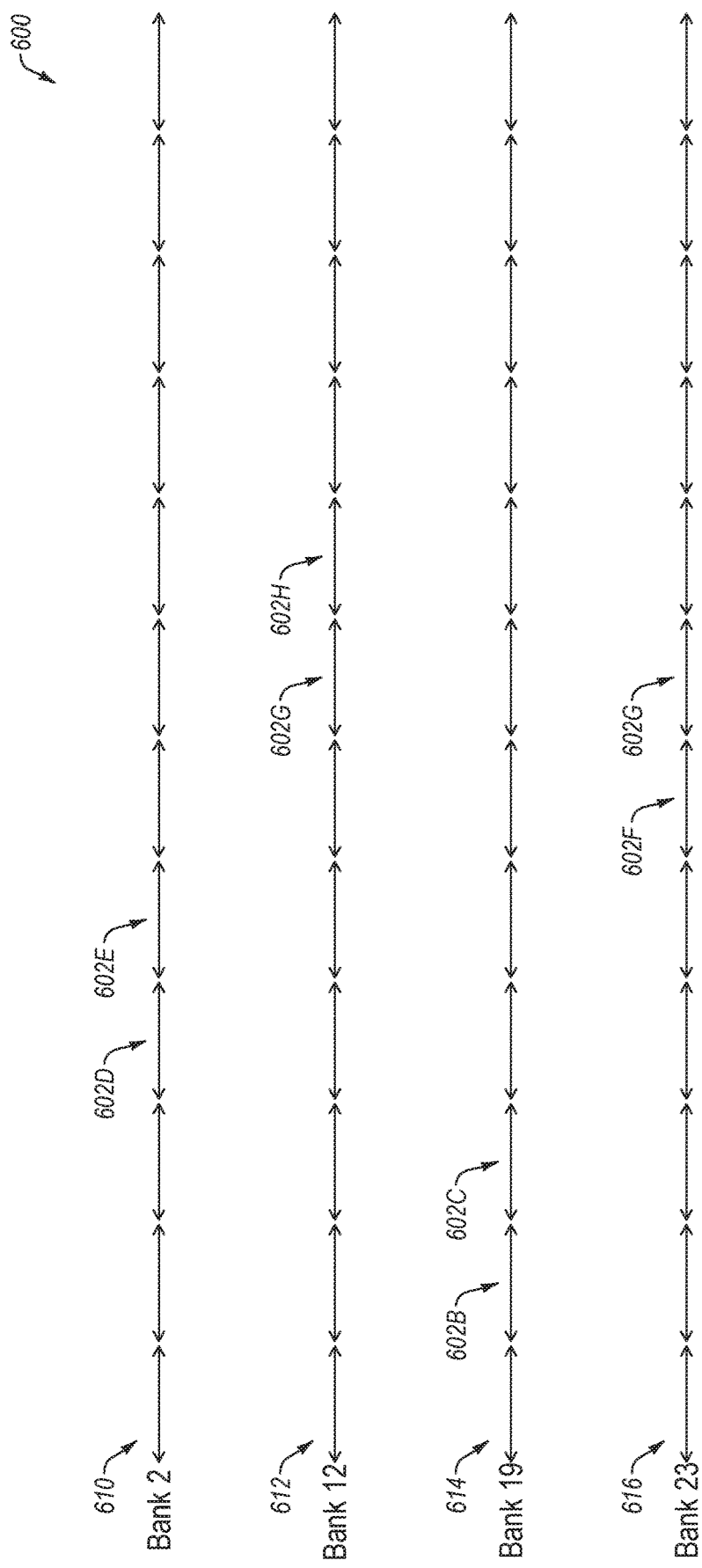
FIG. 6 depicts another timing diagram including number of example time intervals associated with a number of memory banks of a memory device, according to various embodiments of the present disclosure.

FIG. 6 is a timing diagram 600 depicting a number of time intervals 602 for a number of specific memory banks of a memory device. More specifically, timing diagram 600 depicts a number of time intervals 602 for four example memory banks (i.e., Bank 2, Bank 12, Bank 19, and Bank 23) of a memory device. According to various embodiments of the present disclosure, for each time interval (e.g., steal series) of a memory bank that does not include an active signal, a subsequent time interval for the memory bank may not include a RHR operation. More specifically, for example, if time interval 602D for a first memory bank 610 (e.g., "Bank 2") of the memory device does not include an active signal, a subsequent time interval 602E for first memory bank 610 may not include a RHR operation. Further, for example, if time interval 602G for a second memory bank 612 (e.g., "Bank 12") of the memory device does not include an active signal, a subsequent time interval 602H for second memory bank 612 may not include a RHR operation. Moreover, for example, if time interval 602B for a third memory bank 614 (e.g., "Bank 19") of the memory device does not include an active signal, a subsequent time interval 602C for third memory bank 614 may not include a RHR operation. Additionally, for example, if time interval 602F for a fourth memory bank 616 (e.g., "Bank 23") of the memory device does not include an active signal, a subsequent time interval 602G for fourth memory bank 616 may not include a RHR operation.

Figure 7:
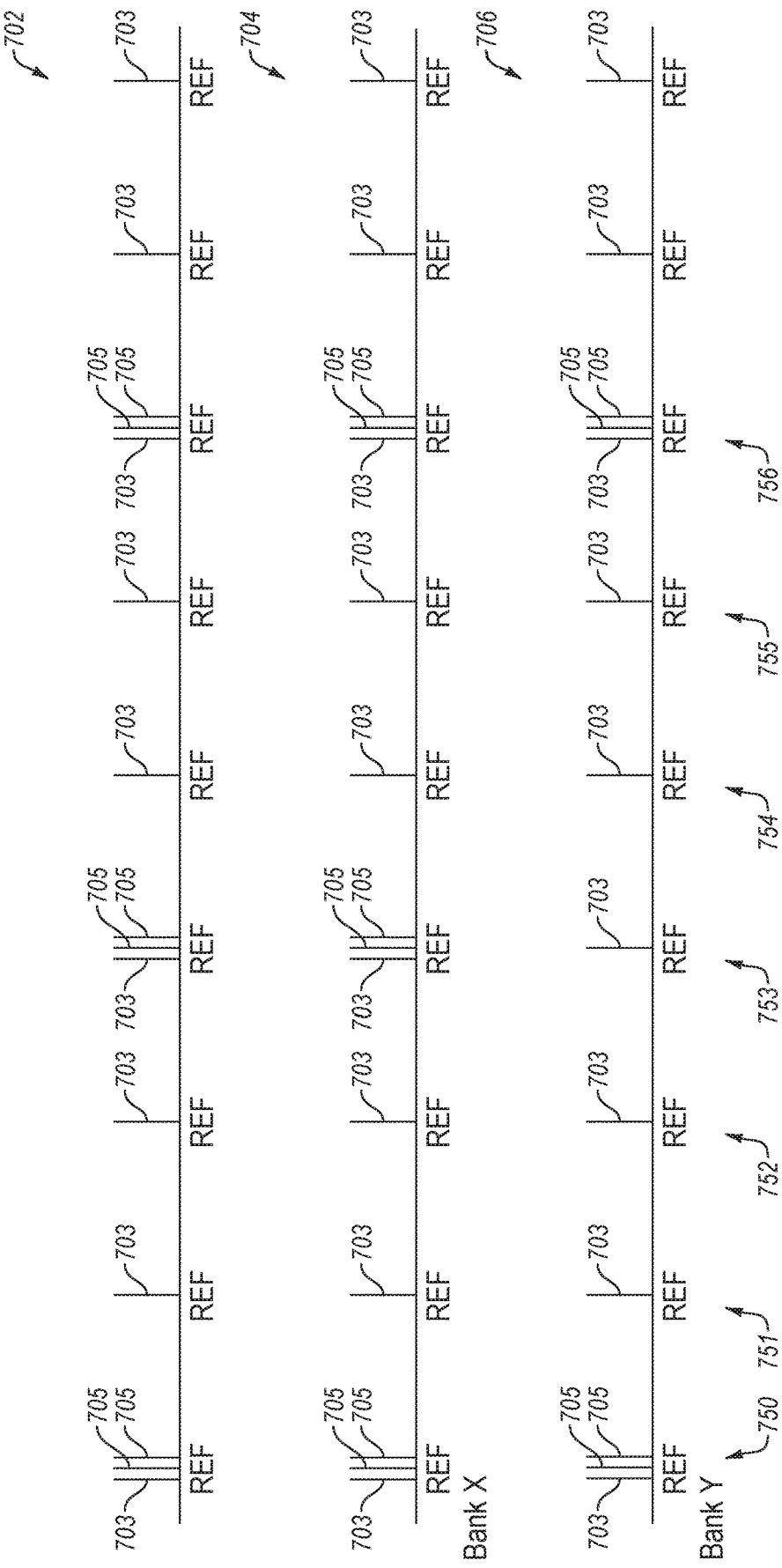
FIG. 7 depicts a number of example refresh sequences associated with a memory device.

FIG. 7 depicts a number of refresh sequences associated with a memory device. More specifically, FIG. 7 depicts a refresh sequence 702 including a number of refresh commands REFs, wherein each refresh command REF includes a number of auto refreshes 703 and RHRs 705. For example, in some embodiments, refresh sequence 702 may represent a default refresh sequence for a memory device (e.g., memory device 100 of FIG. 1), wherein the default refresh sequence may be indicative of a default row hammer refresh rate. In this example, the default row hammer refresh rate of refresh sequence 702 is, for every three refresh commands REFs, two refreshes are stolen for RHRs operations. Other default row hammer refresh rates may occur, such as a maximum row hammer refresh rate (e.g., for every refresh command, two refreshes are stolen for RHRs operations), a minimum row hammer refresh rate (e.g., for every 10 refresh commands, two refreshes are stolen for RHRs operations), or any other row hammer refresh rate.

FIG. 7 further depicts a refresh sequence 704 for one memory bank (i.e., memory bank X) of the memory device, and a refresh sequence 706 for another memory bank (e.g., memory bank Y) of the memory device. As illustrated, each refresh sequence 704/706 includes a number of refresh commands REFs, wherein each refresh command REF includes a number of refreshes (e.g. auto refreshes 703 and RHRs 705).

In this example, as depicted by refresh sequence 704, the row hammer refresh rate of memory Bank X is the same as the row hammer refresh rate depicted by refresh sequence 702. For example, in this embodiment, memory bank X may have received (e.g., during some time interval) at least one active command, and therefore the row hammer refresh rate of memory bank X is unchanged relative to a default row hammer refresh rate.

Continuing with this example, as depicted by refresh sequence 706, the row hammer refresh rate of memory bank Y is different than the row hammer refresh rate depicted by refresh sequence 702. For example, in this embodiment, memory bank Y may have not received (e.g., during some time interval) at least one active command, and therefore the row hammer refresh rate of memory bank Y is reduced relative to a default row hammer refresh rate. As a more specific example, during a first time interval (e.g., a time interval including refresh commands REF 750, 751, and/or 752), memory bank Y may have not received at least one active command, and therefore, unlike memory bank X, memory bank Y does not include a RHR operation during refresh command 753. Stated another way, because memory bank Y did not receive at least one active command during a time interval, a row hammer refresh rate of memory bank Y may be adjusted such that a RHR operation is not performed at memory bank Y during a subsequent time interval (e.g., during refresh command 753).

Further, for example, during a subsequent time interval (e.g., a time interval including refresh commands REF 753, 754, and/or 755), memory bank Y may have received at least one active command, and therefore, like memory bank X, memory bank Y includes a RHR operation during refresh command 756. Stated another way, because at least some activity occurred at memory bank Y during a time interval (e.g., a time interval including refresh commands 753, 754, and/or 755), a row hammer refresh rate of memory bank Y may be adjusted such that a RHR operation is performed at memory bank Y during a subsequent time interval (e.g., during refresh command 756).

Thus, as shown in, for example, FIGS. 5-7, according to various embodiments, row hammer refresh operations for different memory banks of a memory device be independently controlled, and thus, during some time interval, some memory banks of the memory device may perform a row hammer refresh operation and some memory banks of the memory device may not perform a row hammer refresh operation.

As noted above, in some embodiments, a row hammer refresh rate of a memory bank may be adjusted based on an amount of activity of the memory bank. In some embodiments, for example, activity (e.g., one or more active signals) associated with a memory bank of a memory device may be monitored during a sample period (e.g., a time interval). Further, based on the activity (or lack thereof), a row hammer refresh rate of the memory bank may be adjusted (e.g., between sample periods). More specifically, in some embodiments, for example, in response to a memory bank not receiving at least a minimum threshold number (e.g., 1, 5, 10, 20, 50, etc.) of active commands (e.g., during a time interval), the row hammer refresh rate of the memory bank may be adjusted from a one row hammer refresh rate (e.g., a default row hammer refresh rate) to another, lower row hammer refresh rate (e.g., a minimum row hammer refresh rate). Further, for example, in response to a memory bank, which is operating with a reduced row hammer refresh rate (e.g., relative to a default row hammer refresh rate), receiving at least a minimum threshold number of active commands (e.g., during a time interval), the row hammer refresh rate of the memory bank may be adjusted from a lower row hammer refresh rate to a higher row hammer refresh rate (e.g., a default row hammer refresh rate).

Figure 8:
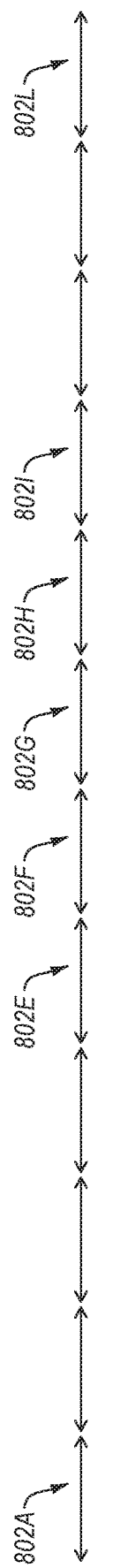
FIG. 8 depicts a timing diagram including a number of example time intervals associated with a memory bank of a memory device, according to various embodiments of the present disclosure.

For example, FIG. 8 depicts a number of time intervals 802A-802L for a memory bank of a memory device (e.g., memory device 100 of FIG. 1). According to various embodiments of the present disclosure, for each time interval of the memory bank, a number of active signals associated with the memory bank (e.g., received at the memory bank) may be counted. Further, based on the number of active signals associated with the memory bank, the row hammer refresh rate for the memory bank may be adjusted. More specifically, for example, if, during a time interval 802E, the memory bank receives 2Z number of active signals, the row hammer refresh rate of the memory device for time interval 802F may be adjusted to a first row hammer refresh rate (e.g., such that for every three refresh commands, two refreshes are stolen for RHR operations). Further, for example, if, during time interval 802F, the memory bank receives 3Z number of active signals, the row hammer refresh rate of the memory device for time interval 802G may be adjusted (i.e., increased) to a second row hammer refresh rate (e.g., such that for every refresh command, two refreshes are stolen for RHR operations). As another example, if, during time interval 802H, the memory bank receives Z number of active signals, the row hammer refresh rate of the memory device for time interval 802I may be adjusted (e.g., decreased) to a third row hammer refresh rate (e.g., such that for every six refresh commands, two refreshes are stolen for RHR operations). Although FIG. 8 depicts a time interval for only one memory bank of a memory device, the same or similar operations may be carried for other memory banks (e.g., all memory banks) of the memory device.

Figure 9:
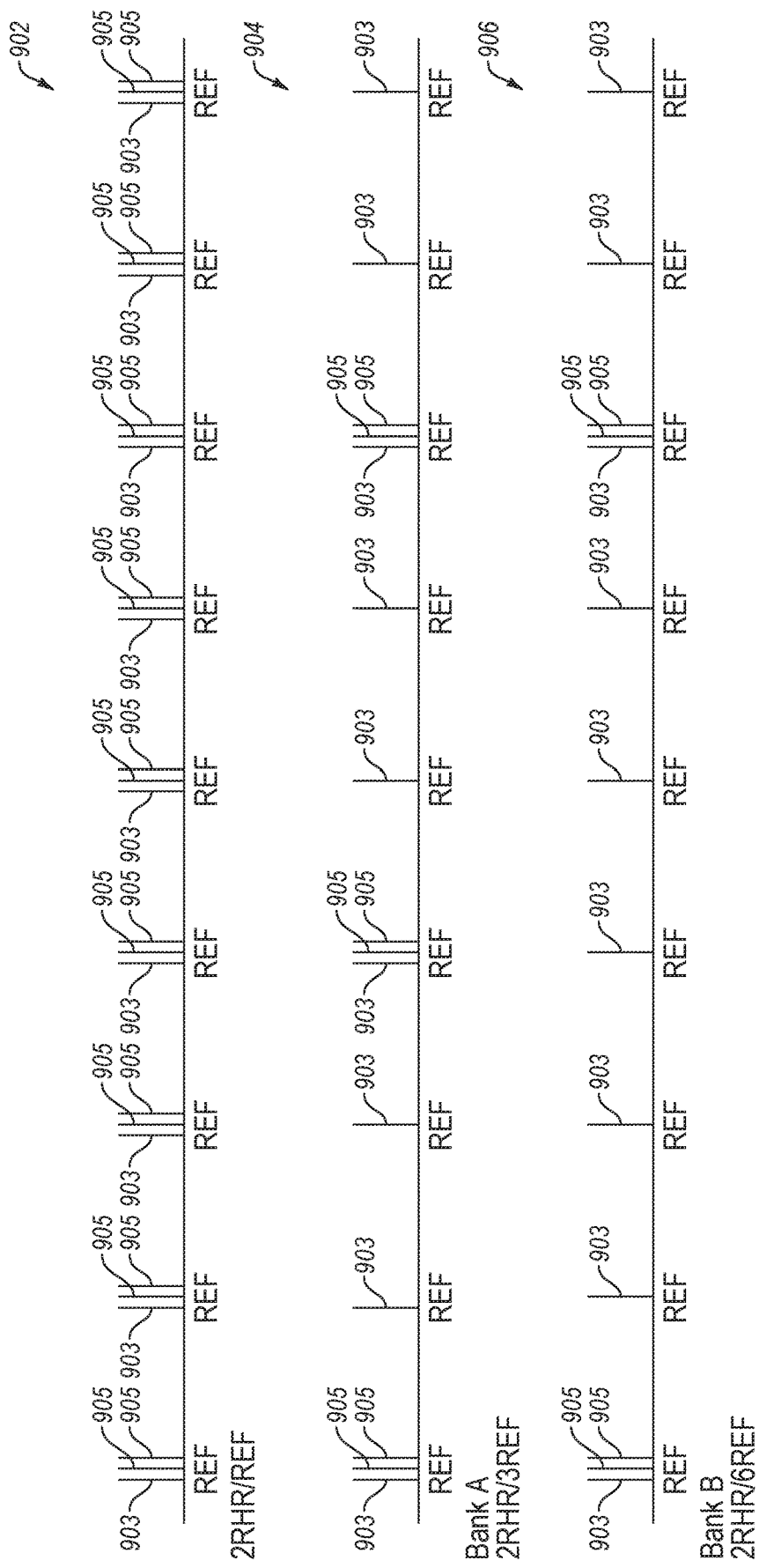
FIG. 9 depicts additional example refresh sequences associated with a number of memory banks of a memory device, in accordance with various embodiments of the present disclosure.

FIG. 9 depicts a number of refresh sequences associated with a memory device. For example, each refresh sequence illustrated in FIG. 9 may be indicative of a refresh rate (e.g., during one or more time intervals, such as time intervals 802A-802L shown in FIG. 8). More specifically, FIG. 9 depicts a refresh sequence 902 of a memory device including a number of refresh commands REFs, wherein each refresh command REF includes a number of refreshes 903 and RHRs 905. In this example, refresh sequence 902 depicts a first row hammer refresh rate, such as a maximum row hammer refresh rate (i.e., for each refresh command REF, two refreshes are stolen for RHRs).

FIG. 9 further depicts a refresh sequence 904 of one memory bank (i.e., memory bank A) of the memory device, and a refresh sequence 906 for another memory bank (e.g., memory bank B) of the memory device. As illustrated, each refresh sequence 904/906 includes a number of refresh commands REFs, wherein each refresh command REF includes a number of refreshes 903 and RHRs 905. In this example, refresh sequence 904 depicts a second row hammer refresh rate (i.e., for every three refresh commands REFs, two refreshes are stolen), and refresh sequence 906 depicts a third row hammer refresh rate (i.e., for every six refresh commands REFS, two refreshes are stolen for RHRs).

Thus, as shown in, for example, FIGS. 8 and 9, according to various embodiments, row hammer refresh rates for different memory banks of a memory device be independently controlled, and thus, during various time intervals (e.g., time intervals 802A-802L of FIG. 8), memory banks of the memory device may operate with different row hammer refresh rates (e.g., as shown in FIG. 9) (e.g., based on a need for row hammer refreshes).

Figure 10A:
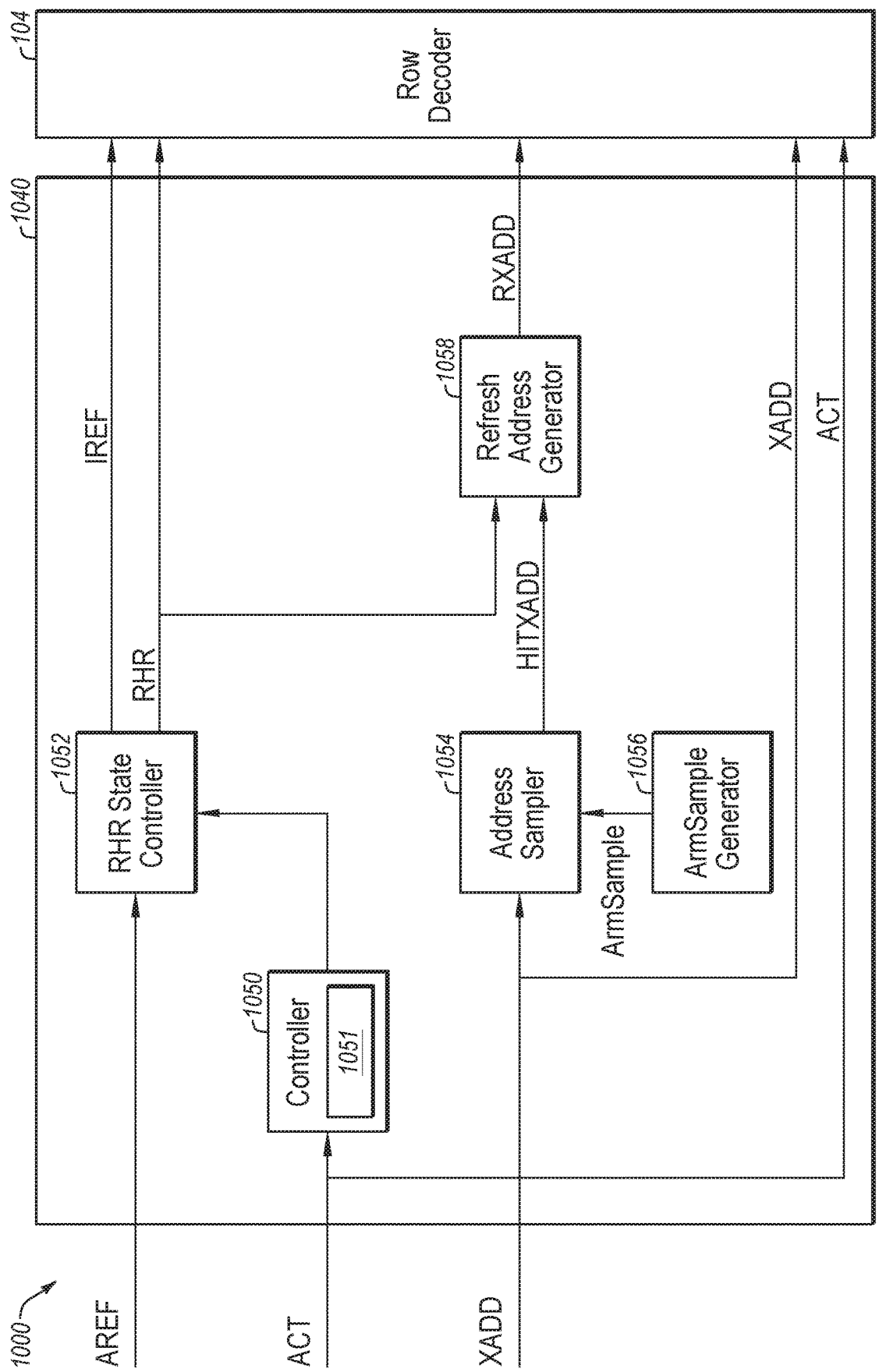
FIG. 10A is a block diagram of a portion of a memory device including an example refresh address control circuit, according to one or more embodiments of the present disclosure.

FIG. 10A is a block diagram of a portion of a memory device 1000 including a refresh address control circuit 1040, according to various embodiments of the present disclosure.

For example, refresh address control circuit 140 of FIG. 1 may include refresh address control circuit 1040. Memory device 1000 further includes row decoder 104 coupled to refresh address control circuit 1040.

In at least some embodiments, at least some components of refresh address control circuit 1040 and/or row decoder 104 may correspond to a particular memory bank of a memory device, and, in at least some embodiments, these components may be repeated for each memory bank of the memory device. Thus, in some embodiments, a memory device (e.g., memory device 100 of FIG. 1) may include multiple refresh address control circuits 1040 and row decoders 104. For the sake of brevity, only components for a single memory bank will be described.

Refresh address control circuit 1040 includes a controller 1050, a RHR state controller 1052, an address sampler 1054, an ArmSample generator 1056, and a refresh address generator 1058. Refresh address control circuit 1040 may be configured to receive various signals, such as auto-refresh signal AREF, row address XADD, and active signal ACT. In some embodiments, refresh address control circuit 1040 may receive one or more of these signals from a memory controller (not shown in FIG. 10A), address decoder 130, and/or command decoder 150 shown in FIG. 1.

ArmSample generator 1056 may be configured to generate a sampling signal ArmSample, which may alternate between a low logic level and a high logic level. An activation of ArmSample may be a "pulse," where ArmSample is raised to a high logic level and then returns to a low logic level.

Address sampler 1054 may be configured to receive row address XADD and ArmSample. In some embodiments, row address XADD may change as access operations (e.g., active operation) are directed to different rows of a memory cell array (e.g., memory cell array 102 of FIG. 1). Each time address sampler 1054 receives an activation (e.g., a pulse) of ArmSample, address sampler 1054 may sample and capture the current value of row address XADD. In some embodiments, address sampler 1054 may provide the currently sampled and captured value of row address XADD as a match address HitXADD to refresh address generator 1058. Refresh address generator 1058 may provide (e.g., to row decoder 104) one or more victim addresses associated with match address HitXADD as refresh address RXADD.

Controller 1050 may be configured to receive active signal ACT. According to various embodiments of the present disclosure, controller 1050, which may include logic such as one or more flip-flops and/or one or more counters 1051, may be configured to count a number of times an active signal ACT is received at the associated memory bank. More specifically, controller 1050 may be configured to count a number of times active signal ACT is received at the associated memory bank during a time interval (e.g., a steal series). In these embodiments, counters 1051 may be reset (e.g., via control logic) (e.g., at the end of the time interval). Further, based on the number of times active signal ACT is received at the associated memory bank (e.g., during the time interval), controller 1050 may generate a signal that is conveyed to RHR state controller 1052.

In some embodiments, controller 1050 may be configured to determine, based on the number of received active signals (e.g., during a time interval), whether or not a row hammer refresh operation should occur at the memory bank and/or at what rate a row hammer refresh should occur (i.e., a row hammer refresh rate). Thus, in these embodiments, a signal sent from controller 1050 to RHR state controller 1052 may include an indication of whether or not a row hammer refresh operation should occur at the memory bank and/or a row hammer refresh rate for the memory bank. In other embodiments, controller 1050 may be configured to count a number of active signals, and convey this information to RHR state controller 1052. In these embodiments, RHR state controller 1052 may be configured to determine whether or not a row hammer refresh operation should occur at the memory bank and/or at what rate a row hammer refresh should occur.

RHR state controller 1052 may include, for example, logic components, and may be configured to control the occurrence and timing refresh operations (e.g., auto refresh and/or RHR operations). For example, based on a signal received from controller 1050, RHR state controller 1052 may provide a signal RHR to activate a row hammer refresh (e.g., a refresh of the victim rows corresponding to an identified aggressor row). As noted above, in some embodiments, RHR state controller 1052 may receive a signal from controller 1050 indicating whether or not a row hammer refresh operation should occur at the memory bank and/or at what rate a row hammer refresh should occur. In other embodiments, based on a signal received from controller 1050, RHR state controller 1052 may be configured to determine whether or not a row hammer refresh operation should occur at the memory bank and/or at what rate a row hammer refresh should occur. In some embodiments, RHR state controller 1052 may assert an internal refresh signal IREF and/or and row hammer refresh signal RHR responsive to a signal received from controller 1050.

In some embodiments, a row hammer refresh rate of a memory bank may be set via one or more bits (e.g., of a multi-bit word). FIG. 10B is a table 1080 illustrating various RHR rates and associated multi-bit words for programming row hammer refresh rates. For example, with reference to FIGS. 10A and 10B, controller 1050 and/or RHR state controller 1052 may set, via the multi-bit word "000," a row hammer refresh rate such that for every refresh command, all refreshes are stolen as row hammer refreshes. As another example, controller 1050 and/or RHR state controller 1052 may set, via the multi-bit word "011," a row hammer refresh rate such that for every four refresh commands, one refresh is stolen as a row hammer refresh. As yet another example, controller 1050 and/or RHR state controller 1052 may set, via the multi-bit word "111," a row hammer refresh rate such that for every eight refresh commands, one refresh is stolen as a row hammer refresh. Other row hammer refresh rates and multi-bit words for programming associated row hammer refresh rates (e.g., as illustrated in FIG. 10B) may be used.

RHR state controller 1052 may also provide internal refresh signal IREF, to indicate that an auto-refresh should occur. Responsive to an activation of RHR, refresh address generator 1058 may provide a refresh address RXADD, which may be an auto-refresh address or may be one or more victim addresses corresponding to victim rows of an aggressor row corresponding to the match address HitXADD. Row decoder 104 may perform a targeted refresh operation responsive to the refresh address RXADD and row hammer refresh signal RHR.

Methods, devices, and systems for determining aggressor and/or victim rows related to row hammer refresh operations are known in the art, and thus details related to determining aggressor and/or victim rows will not be described in detail.

With continued reference to FIG. 10A, refresh address generator 1058 may receive the row hammer refresh signal RHR and match address HitXADD. Match address HitXADD may represent an aggressor row. Refresh address generator 1058 may determine the locations of one or more victim rows based on the match address HitXADD and provide them as the refresh address RXADD. In some embodiments, the victim rows may include rows that are physically adjacent to the aggressor row (e.g., HitXADD+1 and HitXADD−1). Further, in some embodiments, the victim rows may also include rows that are physically adjacent to the physically adjacent rows of the aggressor row (e.g., HitXADD+2 and HitXADD−2). Other relationships between victim rows and the identified aggressor rows may be used in other examples.

Refresh address generator 1058 may determine the value of the refresh address RXADD based on the row hammer refresh signal RHR. In some embodiments, when the signal RHR is not active, refresh address generator 1058 may provide one of a sequence of auto refresh addresses. When the signal RHR is active, the refresh address generator 1058 may provide a targeted refresh address, such as a victim address, as the refresh address RXADD.

Row decoder 104 may perform one or more operations on the memory array (not shown) based on the received signals and addresses. For example, responsive to the active signal ACT and the row address XADD (and IREF and RHR being at a low logic level), row decoder 104 may direct one or more access operations (e.g., an active operation) on the specified row address XADD. Responsive to the RHR signal being active, row decoder 104 may refresh the refresh address RXADD.

Although controller 1050 is illustrated as being a separate component, in some embodiments, RHR state controller 1052 may include controller 1050, or vice versa. Further, in some embodiments, instead of a memory device (e.g., memory device 100) including a dedicated controller for each memory bank, a memory device may include a number controllers that is less than or equal to a number of memory banks. For example, in some embodiments, at least one controller external to one or more memory banks may be used to control, set, and/or adjust a row hammer refresh rate of the one or more memory banks. For example, in at least some embodiments, a memory device may include one or more controllers configured for monitoring activity associated with one or more memory banks of the memory device. The one or more controllers may also be configured for conveying one or more signals to the one or more memory banks for controlling, setting and/or adjusting a row hammer refresh rate of the one or more memory banks. More specifically, the one or more controllers may be configured to independently monitor (e.g., activity) and control (e.g., set and/or adjust a row hammer refresh rate) each memory bank of the memory device.

Further, in at least some other embodiments, at least one controller external to a memory device may be configured to determine an amount of activity associated with each memory bank. For example, the at least one external controller may be configured to receive and/or sense one or more signals sent to and/or received from a memory device indicative of an amount of activity associated with one or more memory banks of the memory device. More specifically, for example, the at least one controller may be configured to receive and/or sense an active signal sent to a memory bank. Further, in these embodiments, the at least one controller may be configured to control, set, and/or adjust a row hammer refresh operation and/or a row hammer refresh rate of one or more memory banks of a memory device. For example, in these embodiments, the at least one controller may send one or more signals to a memory device (e.g., memory device 100 of FIG. 1) (e.g., via command terminals 112) to control, set, and/or adjust a row hammer refresh operation and/or a row hammer refresh rate of one or more memory banks.

In each of these embodiments, a controller may be configured to control (e.g., activate and deactivate) a row hammer refresh operation of a memory bank based on whether or not any activity has occurred (e.g., whether or not an active signal has been received). Alternatively or additionally, a controller may be configured to set and/or adjust a row hammer refresh rate of a memory bank based on an amount of activity that has occurred (e.g., based on how many active signals have been received at the memory bank).

Figure 11:
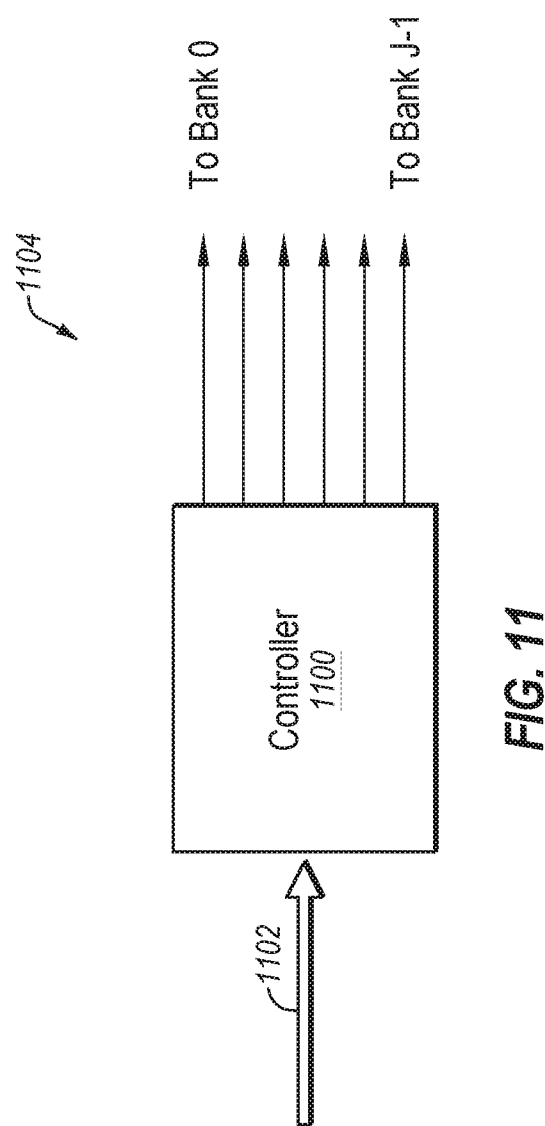
FIG. 11 is a block diagram of an example controller, in accordance with various embodiments of the present disclosure.

FIG. 11 depicts a controller 1100, according to various embodiments of the present disclosure. According to various embodiments, controller 1100 may implemented within a memory device or may be external to a memory device. Controller 1100 may be configured to receive one or more signals 1102. For example, signal 1102, which may include one or more signals, may be received from a component within a memory device or external to a memory device. Signal 1102 may be indicative of activity associated with one or more memory banks of the memory device. Controller 1100 may also be configured to convey one or more signals 1104 to one or more memory banks (Bank 0-Bank J–1). More specifically, for example, controller 1100 may be configured to send at least one signal to each memory bank of the memory device.

As a non-limiting example, controller 1100 may include one or more counters (e.g., one counter for each memory bank) for counting a number of active signals sent to and/or received at each memory bank (e.g., during a time interval). For example, controller 1100 may, based one or more received signals and a value stored in a counter associated with a first memory bank, determine that the first memory bank has received M number of active signals during a first time interval. In response thereto, controller 1100 may convey a signal (e.g., to the first memory bank) to increase a row hammer refresh rate of the first memory bank (e.g., for a second time interval). Further, for example, controller 1100 may, based one or more received signals and a value stored in a counter associated with a second memory bank, determine that the second memory bank has received N (wherein N<M) number of active signals during the first time interval. In response thereto, controller 1100 may convey a signal (e.g., to the second memory bank) to decrease a row hammer refresh rate of the second memory bank (e.g., for a second time interval).

Various embodiments of the disclosure may be applicable per memory bank of a memory bank. For example, the embodiments described above with reference to FIGS. 5-11 may be applicable to each memory bank of a memory device, or some subset of memory banks of the memory device. More specifically, for example, in some embodiments, a memory device may be configured to count active signals associated with each memory bank, and adjust a row hammer refresh rate of each bank of the memory device based on the number of associated active signals. In other embodiments, a memory device may configured activate or deactivate a row hammer refresh operation of each bank of the memory device based the whether or not the memory bank has received one or more active signals. In yet other embodiments, a row hammer refresh rate of some memory banks of a memory device may be adjustable based on a number of active signals, and a row hammer refresh rate of other memory banks of the memory device may be activated or deactivated based whether or not any activity is detected (e.g., whether or not at least one active signal is received).

Figure 12:
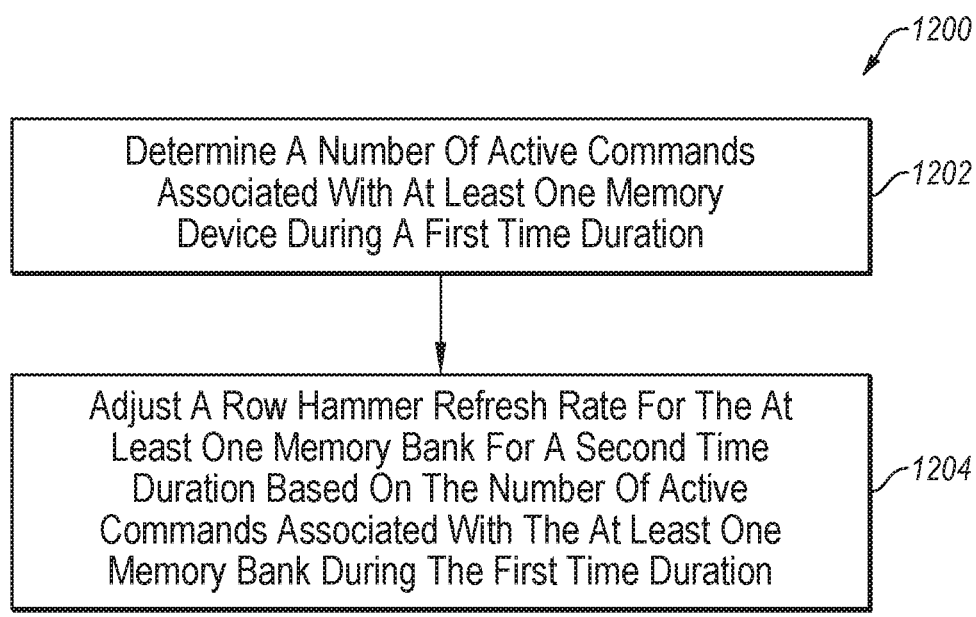
FIG. 12 is a flowchart of an example method of operating a memory device, in accordance with various embodiments of the present disclosure.

FIG. 12 is a flowchart of an example method 1200 of operating a memory device, in accordance with various embodiments of the disclosure. Method 1200 may be arranged in accordance with at least one embodiment described in the present disclosure. Method 1200 may be performed, in some embodiments, by a device or system, such as memory device 100 of FIG. 1, integrated circuit 200 of FIG. 2, refresh address control circuit 1040 of FIG. 10A, controller 1100 of FIG. 11, memory device 1300 of FIG. 13, and/or electronic system 1400 of FIG. 14, or another device or system. Although illustrated as discrete blocks, various blocks may be divided into additional blocks, combined into fewer blocks, or eliminated, depending on the desired implementation.

Method 1200 may begin at block 1202, where an amount of activity associated with one or more memory banks of a memory device may be determined, and method 1200 may proceed to block 1204. For example, in some embodiments, for each memory bank of the memory device, it may be determined whether or not the memory bank received an active signal during a time interval. Further, in some embodiments, for each memory bank, it may be determined how many active signals the memory bank received during the time interval. For example, one or more counters within a memory bank and/or external to the memory bank may count the number of active signals received at the memory bank during the time interval. Further, in this example, the one or more counters may be reset upon completion of the time interval.

At block 1204, a row hammer refresh rate of at least one memory bank of the one or more memory banks may be set and/or adjusted based on the determined amount of activity for the at least one memory bank. For example, based on the determined amount of activity for the at least one memory bank, the row hammer refresh rate of the at least one memory bank may be increased or decreased and/or a row hammer refresh operation of the at least one memory bank may be activated or deactivated. More specifically, for example, if, during the first time interval, a memory bank did not receive an active signal, the memory bank may not perform a row hammer refresh operation during a subsequent time interval (e.g., the row hammer refresh operation may be deactivated, assuming it was in an activated state). Further, for example, if, during the first time interval, a memory bank did receive an active signal, the memory bank may perform a row hammer refresh operation during a subsequent time interval (e.g., the row hammer refresh operation may be activated, assuming it was in a deactivated state). As another example, if, during the first time interval, a memory bank did not receive more than a first threshold number (e.g., 1, 5, 10, 20, 30, or more) of active signals, the row hammer refresh rate for the memory bank may be decreased or unmodified (e.g., for a subsequent time interval). Similarly, if, during the first time interval, a memory bank received more than a second threshold number (e.g., 10, 20, 50, 100, or more.) of active signals, the row hammer refresh rate for the memory bank may be increased or unmodified (e.g., for a subsequent time interval).

Modifications, additions, or omissions may be made to method 1200 without departing from the scope of the present disclosure. For example, the operations of method 1200 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, in various embodiments, the determined amount of activity for each memory bank may be compared to a threshold amount of activity. Further, in addition to adjusting a row hammer refresh rate of the at least one memory bank during the second time interval, the method may include determining an amount of activity for the one or more memory banks of a memory device during the second time interval. Further, based on the amount of activity during the second time interval, a row hammer refresh rate of the at least one memory bank for a third time interval may or may not be adjusted.

A memory device is also disclosed. According to various embodiments, the memory device may include one or more memory cell arrays, such as memory cell array 102 (see FIG. 1). The one or more memory cell arrays may include a number of memory banks.

Figure 13:
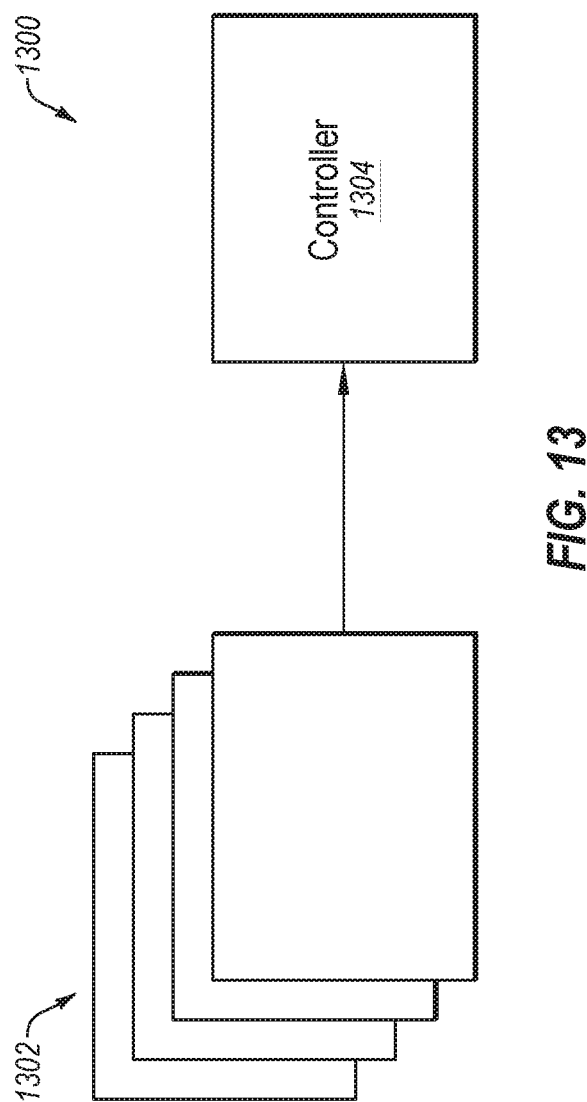
FIG. 13 is a simplified block diagram of an example memory device implemented according to one or more embodiments described herein.

FIG. 13 is a simplified block diagram of a memory device 1300 implemented according to one or more embodiments described herein. Memory device 1300, which may include, for example, a semiconductor device, includes a memory array 1302 and controller 1304. Memory array 1302, which may include a number of memory banks, may include a number of memory cells.

Controller 1304 may be operatively coupled with memory array 1302 so as to read, write, or refresh any or all memory cells within memory array 1302. Controller 1304 may be configured for carrying out one or more embodiments disclosed herein. For example, in some embodiments, controller 1304, which may include, for example, controller 1050 of FIG. 10A and/or controller 1100 of FIG. 11, may be configured to determine an amount of activity associated with a memory bank and set and/or adjust a row hammer refresh rate of the memory bank, in accordance with various embodiments disclosed herein.

A system is also disclosed. According to various embodiments, the system may include a memory device including a number of memory banks, each memory bank having an array of memory cells. Each memory cell may include an access transistor and a storage element operably coupled with the access transistor.

Figure 14:
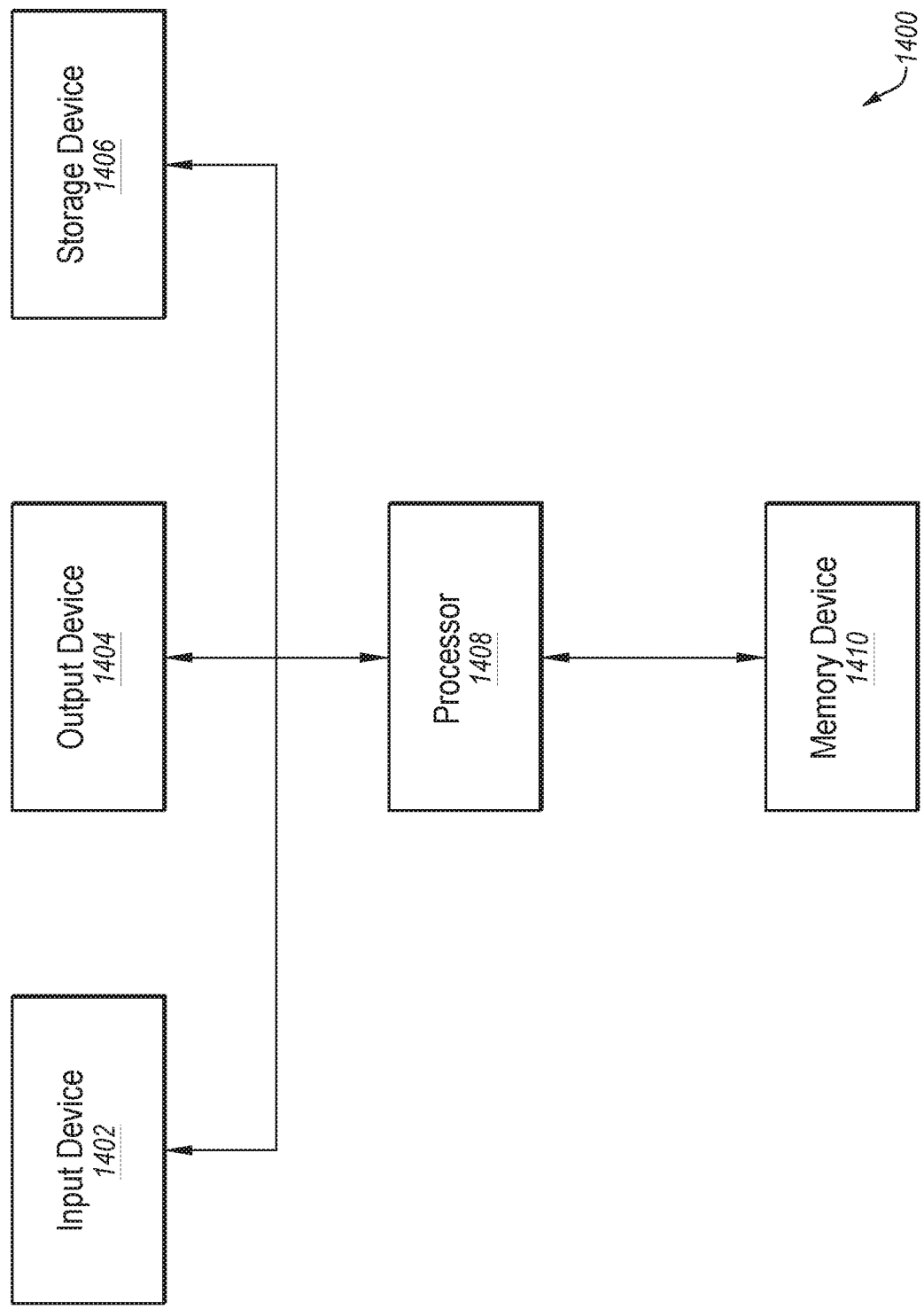
FIG. 14 is a simplified block diagram of an example electronic system implemented according to one or more embodiments described herein.

FIG. 14 is a simplified block diagram of an electronic system 1400 implemented according to one or more embodiments described herein. Electronic system 1400 includes at least one input device 1402, which may include, for example, a keyboard, a mouse, or a touch screen. Electronic system 1400 further includes at least one output device 1404, such as a monitor, a touch screen, or a speaker. Input device 1402 and output device 1404 are not necessarily separable from one another. Electronic system 1400 further includes a storage device 1406. Input device 1402, output device 1404, and storage device 1406 may be coupled to a processor 1408. Electronic system 1400 further includes a memory device 1410 coupled to processor 1408. Memory device 1410, which may include memory device 1300 of FIG. 13, may include an array of memory cells. Electronic system 1400 may include, for example, a computing, processing, industrial, or consumer product. For example, without limitation, electronic system 1400 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

According to various embodiments disclosed herein, and in contrast to some conventional devices, systems and methods, a row hammer refresh rate of one or more memory banks of a memory device may be independently adjustable. More specifically, a row hammer refresh rate of a memory bank may be adjusted based on an amount of activity of the memory bank. Thus, in comparison to conventional devices, systems, and methods, various embodiments may provide for reduced power consumption and/or processing overhead of a memory device with little or no reduction in performance and/or reliability of the memory device.

One or more embodiments of the present disclosure include a method of operating a memory device. The method may include determining a number of active commands associated with at least one memory bank of a memory device during a first time interval. The method may also include adjusting a row hammer refresh rate for the at least one memory bank for a second time interval based on the number of active commands associated with the at least one memory bank during the first time interval.

Some embodiments of the present disclosure include a memory device. The memory device may include a memory array including a number of memory banks. The memory may also include at least one controller configured to adjust a row hammer refresh rate of at least one memory bank of the number of memory banks based on an amount of activity associated with the at least one memory bank.

Additional embodiments of the present disclosure include an electronic system. The electronic system may include at least one input device, at least one output device, and at least one processor device operably coupled to the input device and the output device. The electronic system may also include at least one memory device operably coupled to the at least one processor device and including a memory cell array including a number of memory banks and at least one controller. The at least one controller may be configured to detect row accesses associated with at least one memory bank of the number of memory banks. The at least one controller may also be configured to set a row hammer refresh rate for the least one memory bank based on a number of detected row accesses associated with the at least one memory bank.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A method of operating a memory device, comprising:
    determining a number of active commands associated with at least one memory bank of a memory device during a first time interval; and
    adjusting a row hammer refresh rate for the at least one memory bank for a second time interval based on the number of active commands associated with the at least one memory bank during the first time interval.

2. The method of claim 1, wherein determining the number of active commands associated with at least one memory bank comprises determining the number of active commands received at the at least one memory bank.

3. The method of claim 1, wherein adjusting the row hammer refresh rate comprises increasing the row hammer refresh rate in response to the number of active commands being greater than a threshold number.

4. The method of claim 1, wherein adjusting the row hammer refresh rate comprises decreasing the row hammer refresh rate in response to the number of active commands being less than a threshold number.

5. The method of claim 1, wherein adjusting the row hammer refresh rate comprises at least one of:
    decreasing a row hammer refresh rate of a first memory bank of the at least one memory bank in response to the number of active commands associated with the first memory bank being less than a threshold number; and
    increasing a row hammer refresh rate of a second, different memory bank of the at least one memory bank in response to the number of active commands associated with the second, different memory bank being greater than the threshold number.

6. The method of claim 1, further comprising:
    determining a number of active commands associated with the at least one memory bank of a memory device during the second time interval; and
    adjusting the row hammer refresh rate for the at least one memory bank for a third time interval based on the number of active commands associated with the at the at least one memory bank during the second time interval.

7. The method of claim 1, wherein adjusting the row hammer refresh rate for the second time interval comprises setting the row hammer refresh rate to a default row hammer refresh rate based on the number of active commands being greater than a threshold number.

8. A memory device, comprising:
    a memory array including a number of memory banks; and
    at least one controller configured to adjust a row hammer refresh rate of at least one memory bank of the number of memory banks based on an amount of activity associated with the at least one memory bank.

9. The memory device of claim 8, wherein the at least one controller is coupled to each memory bank of the number of memory banks and is configured for conveying a signal to each memory bank for independently controlling the row hammer refresh rate associated therewith.

10. The memory device of claim 8, wherein the at least one controller includes a number of controllers, wherein each memory bank of the number of memory banks includes a controller of the number of controller for adjusting the row hammer refresh rate associated therewith.

11. The memory device of claim 8, wherein the at least one controller is further configured to determine the amount of activity associated with the at least one memory bank.

12. The memory device of claim 8, wherein the amount of activity is based a number of active signals received at the at least one memory bank.

13. The memory device of claim 8, wherein the at least one controller is configured to adjust the row hammer refresh rate of at least one memory bank in response to a comparison of the amount of activity associated with the at least one memory bank to a threshold amount of activity.

14. An electronic system, comprising:
   at least one input device;
   at least one output device;
   at least one processor device operably coupled to the input device and the output device; and
   at least one memory device operably coupled to the at least one processor device and comprising:
      a memory cell array including a number of memory banks; and
      at least one controller configured to:
         detect row accesses associated with at least one memory bank of the number of memory banks; and
         set a row hammer refresh rate for the at least one memory bank based on a number of detected row accesses associated with the at least one memory bank.

15. The electronic system of claim 14, wherein the at least one controller comprises a number of controllers, wherein each memory bank includes a controller of the number of controllers.

16. The electronic system of claim 14, wherein the at least one controller is coupled to the at least one memory bank and configured to convey one or more control signals to the at least one memory bank to set the row hammer refresh rate of at the at least one memory bank.

17. The electronic system of claim 14, wherein the at least one controller is configured to:
   detect row accesses associated with the at least one memory bank for a time interval of a number of time intervals; and
   set the row hammer refresh rate for the at least one memory bank for another, subsequent time interval of the number of time intervals.

18. The electronic system of claim 14, wherein the at least one controller is further configured to:
   compare the number of detected row accesses for the at least one memory bank to a threshold number of row accesses; and
   set the row hammer refresh rate for the at least one memory bank based on the comparison.

19. The electronic system of claim 18, wherein the at least one controller is further configured to:
   decrease the row hammer refresh rate of the at least one memory bank in response to the number of detected row accesses for the at least one memory bank being less than the threshold number of row accesses; and
   increase the row hammer refresh rate of the at least one memory bank in response to the number of detected row accesses for the at least one memory bank being greater than or equal to the threshold number of row accesses.

20. The electronic system of claim 14, wherein the at least one controller comprises at least one counter for counting detected row accesses associated with the at least one memory bank.

* * * * *